(12) United States Patent
Kwon et al.

(10) Patent No.: US 8,269,806 B2
(45) Date of Patent: Sep. 18, 2012

(54) METHOD OF MANUFACTURING IMAGE FORMING ELEMENT, IMAGE FORMING ELEMENT, AND IMAGE FORMING APPARATUS HAVING THE SAME

(75) Inventors: Ki-hwan Kwon, Hwaseong-si (KR);
Soon-cheol Kweon, Seoul (KR);
Chang-youl Moon, Suwon-si (KR);
Seong-taek Lim, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1112 days.

(21) Appl. No.: 12/119,557

(22) Filed: May 13, 2008

(65) Prior Publication Data
US 2009/0142712 A1    Jun. 4, 2009

(30) Foreign Application Priority Data

Nov. 29, 2007 (KR) .......................... 10-2007-0122928

(51) Int. Cl.
*B41J 2/41* (2006.01)
(52) U.S. Cl. ....................................................... 347/112
(58) Field of Classification Search .................. 430/324, 430/325; 399/159; 347/112
See application file for complete search history.

(56) References Cited

U.S. PATENT DOCUMENTS

| | | | | |
|---|---|---|---|---|
| 4,137,628 A | * | 2/1979 | Suzuki | 29/827 |
| 5,508,727 A | * | 4/1996 | Zur | 347/112 |
| 6,947,202 B2 | * | 9/2005 | Liang et al. | 359/296 |
| 2002/0158956 A1 | * | 10/2002 | Van Der Meer et al. | 347/141 |
| 2003/0138704 A1 | * | 7/2003 | Mei et al. | 430/5 |
| 2008/0124126 A1 | * | 5/2008 | Anezaki et al. | 399/159 |

* cited by examiner

*Primary Examiner* — Brittany Raymond
(74) *Attorney, Agent, or Firm* — Stanzione & Kim, LLP (57) ABSTRACT

A method of manufacturing an image forming element which can reduce a manufacturing time and a manufacturing cost with a simplified manufacturing process, an image forming element manufactured by the method, and an image forming apparatus having the same. The method includes preparing a cylindrical image drum having at least one slot formed along a lengthwise direction, arranging a control board having a plurality of terminals inside the image drum such that the plurality of terminals are located in the slot, forming a photosensitive resin layer on an outer circumference of the image drum, processing the photosensitive resin layer to form a plurality of installation recesses along a circumference of the image drum in correspondence to the plurality of terminals and a plurality of connection holes to expose the terminals through an area of each of the installation recesses, and forming a plurality of ring electrodes in the installation recesses to connect to the plurality of terminals through the connection holes.

11 Claims, 10 Drawing Sheets

METHOD OF MANUFACTURING IMAGE FORMING ELEMENT, IMAGE FORMING ELEMENT, AND IMAGE FORMING APPARATUS HAVING THE SAME

CROSS-REFERENCE TO RELATED APPLICATIONS

This application claims priority under 35 U.S.C. §119 (a) from Korean Patent Application No. 10-2007-0122928, filed on Nov. 29, 2007, in the Korean Intellectual Property Office, the disclosure of which is incorporated herein by reference in its entirety.

BACKGROUND OF THE INVENTION

1. Field of the Invention

The present general inventive concept relates to a method of manufacturing an image forming element which is used in an image forming apparatus adopting a direct printing method, an image forming element manufactured by this method, and an image forming apparatus having the image forming element.

2. Description of the Related Art

An image forming apparatus adopting a direct printing method forms a latent image by directly applying an image signal to an image forming element and then forms an image by developing the latent image. Accordingly, this type of image forming apparatus does not require a laser scanning device or a charging device which is required for an image forming apparatus adopting an electrophotographing method, and also has a stable property in a processing level. Therefore, the image forming apparatus adopting the direct printing method has been steadily developed.

A general image forming element used in the image forming apparatus adopting the direct printing method comprises a cylindrical image drum, a plurality of ring electrodes arranged along an outer circumference of the image drum, and a control circuit board disposed inside the image drum.

The image drum is made of aluminum or aluminum alloy. The plurality of ring electrodes are insulated from one another due to an insulation layer formed along the outer circumference of the image drum, and also are insulated from the image drum. Each of the ring electrodes is electrically connected to a terminal provided on the control circuit board through a penetrating hole formed through the image drum.

The terminal of the control circuit board and each of the ring electrodes are electrically connected to each other using a zebra-strip. The control circuit board applies an appropriate voltage to each of the ring electrodes according to image data, and accordingly, a predetermined latent image is formed on the image forming element.

However, a conventional method for manufacturing such an image forming element requires complicated manufacturing processes such as a precise surface treatment, a minute pattern processing and a drilling using a laser beam, an electronic beam or a diamond cutting machine, a coating of an epoxy layer and a dielectric layer, and a coating of a conductive particle, and also requires a high manufacturing cost.

SUMMARY OF THE INVENTION

The present general inventive concept provides a method of manufacturing an image forming element, which can reduce a manufacturing cost and a manufacturing time with a simplified manufacturing process, and an image forming element manufactured by this method.

Also, the present general inventive concept provides an image forming apparatus having the image forming element.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing a method of manufacturing an image forming element, the method including preparing a cylindrical image drum having at least one slot formed along a lengthwise direction, arranging a control board having a plurality of terminals inside the image drum such that the plurality of terminals are located in the slot, forming a photosensitive resin layer on an outer circumference of the image drum, processing the photosensitive resin layer to form a plurality of installation recesses along a circumference of the image drum in correspondence to the plurality of terminals and a plurality of connection holes to expose the terminals through an area of each of the installation recesses, and forming a plurality of ring electrodes in the installation recesses and the connection holes.

The processing operation may form the installation recesses by pressing the photosensitive resin layer and may form the connection holes by selectively removing the photosensitive resin layer using a photolithography process.

The processing operation may use a pressure plate which is made of a material permeable to ultraviolet rays, and the pressure plate may include a plurality of pressure protrusions corresponding to the installation recesses and a plurality of ultraviolet ray-blocking members to block transmission of the ultraviolet rays to form the connection holes.

The processing operation may include bring the image drum and the pressure plate into press-contact with each other such that the ultraviolet ray-blocking members face the terminals, exposing the photosensitive resin layer to the ultraviolet rays via the pressure plate, rotating the image drum in press-contact with the pressure plate, and developing the photosensitive resin layer.

The exposing operation and the rotating operation may be performed simultaneously.

The photosensitive resin layer may be formed of a negative type photosensitive resin, and, in this case, the plurality of ultraviolet ray-blocking members may be disposed in the pressure protrusions.

The pressure plate may include the plurality of pressure protrusions and a support plate to support the pressure protrusions, and the ultraviolet ray-blocking members may be disposed between the support plate and the pressure protrusions.

The pressure protrusions may be formed of a soft polydimethylsiloane (PDMS).

The forming of the ring electrodes may include supplying conductive ink to the installation recesses and the connection holes.

The foregoing and/or other aspects and utilities of the general inventive concept may also be achieved by providing an image forming element manufactured by the above-described method.

The foregoing and/or other aspects and utilities of the general inventive concept may also be achieved by providing an image forming apparatus including a toner supply unit, an image forming element to which a toner is adhered from the toner supply unit, and an image developing unit to separate at least a part from the toner adhered to the image forming element, develop an image on the image forming body, and transfer the image to a printing medium, and the image forming element includes a cylindrical image drum which has at least one slot formed along a lengthwise direction, a control board which has a plurality of terminals to be located in the slot and is arranged inside the image drum, an insulation layer which is formed by coating a photosensitive resin over an outer circumference of the image drum, and includes a plurality of installation recesses which are formed along a circumference of the image drum by being pressed by a plurality of pressure protrusions corresponding to the plurality of terminals, and a plurality of connection holes which are formed by selectively removing areas facing the plurality of terminals through a photolithography process; and a plurality of ring electrodes which are formed in the installation recesses and the connection holes.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF EXEMPLARY EMBODIMENTS

Reference will now be made in detail to the embodiments of the present general inventive concept, examples of which are illustrated in the accompanying drawings, wherein like reference numerals refer to the like units throughout. The embodiments are described below in order to explain the present general inventive concept by referring to the numerals.

Figure 1A:
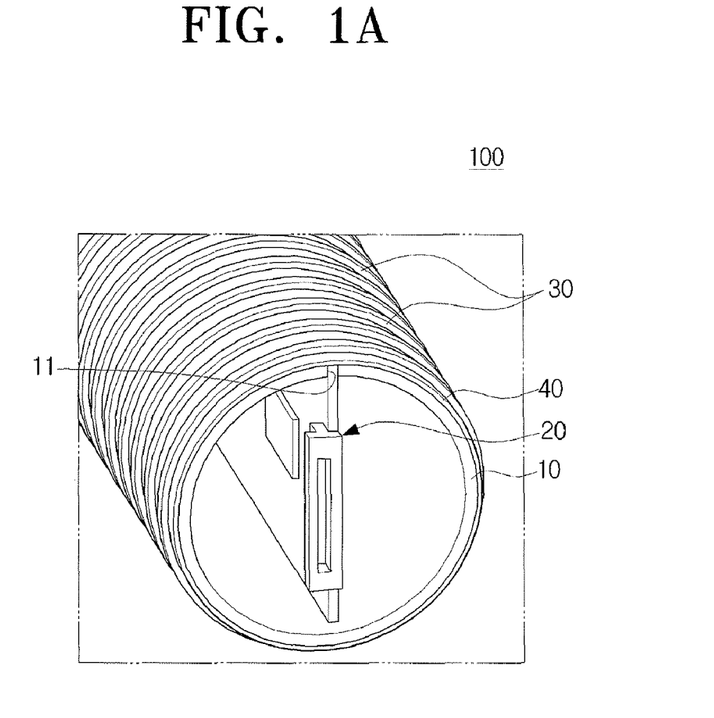
FIGS. 1A and 1B are a perspective view and a cross-section view, respectively, schematically illustrating an image forming element according to an exemplary embodiment of the present general inventive concept.
Figure 1B:
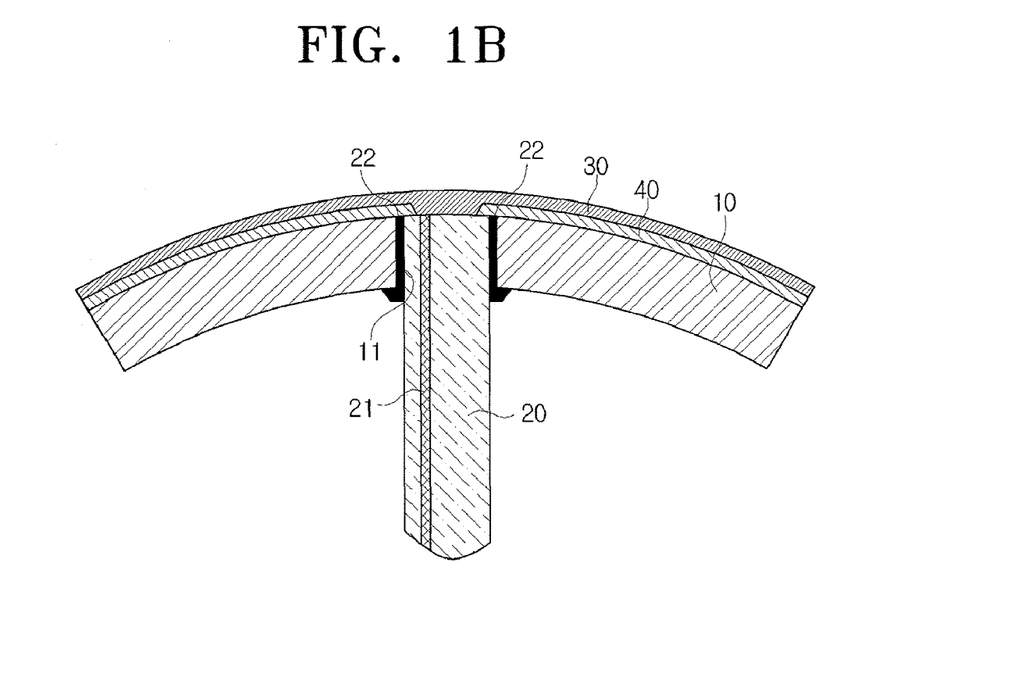

Referring to FIGS. 1A and 1B, an image forming element 100 of an image forming apparatus according to an exemplary embodiment of the present general inventive concept comprises an image drum 10, a control board 20, and a plurality of ring electrodes 30.

Figure 2A:
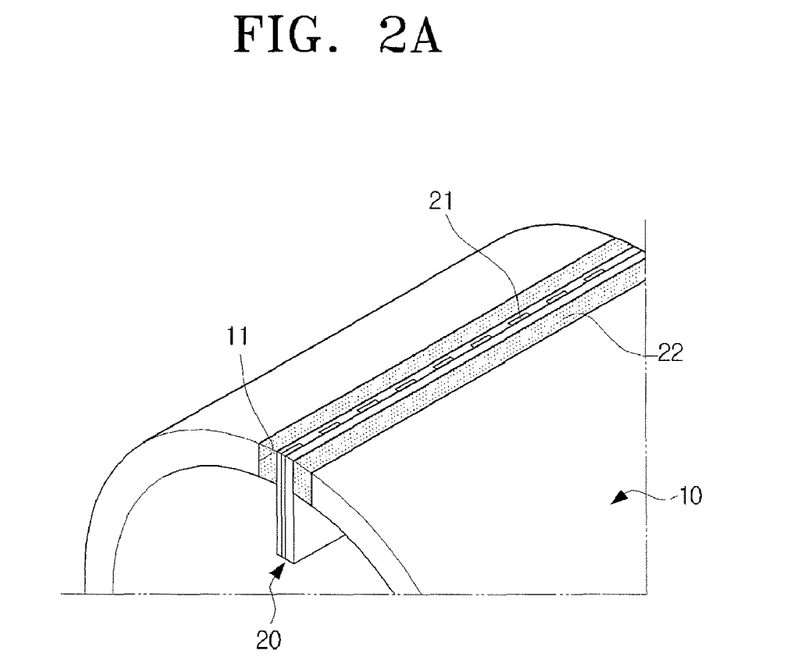
FIGS. 2A and 2B are a perspective view and a cross-section view, respectively, schematically illustrating a control board mounted in an image drum according to the exemplary embodiment of the present general inventive concept.
Figure 2B:
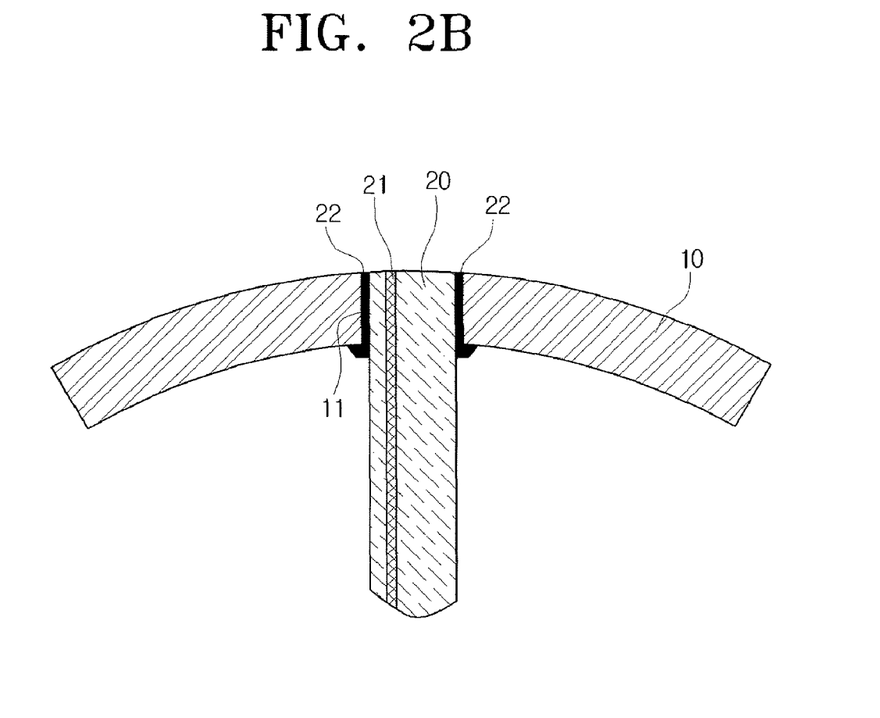

The image drum 10 is a cylindrical drum having at least one slot 11 formed in a lengthwise direction thereof as shown in FIGS. 2A and 2B. The image drum 10 may be made of an aluminum (Al) material which has a high thermal conductivity, a high mechanical strength and a good processability.

The control board 20 has a plurality of terminals 21 and is disposed inside the image drum 10 such that the terminals 21 are located in the slot 11. More specifically, the control board 20 is inserted into and supported by the slot 11 such that an edge of the control board 20 forms a smooth outer surface in unison with an outer circumference of the image drum 10. Accordingly, the plurality of terminals 21 provided in the control board 20 are exposed to the outside through the slot 11 and are connected to the plurality of ring electrodes, which will be described below, in one-to-one correspondence.

The control board 20 is bonded onto the slot 11 by a fixing member 22 after its one side is inserted into the slot 11, and thus is fixed to the slot 11 of the image drum 10. The fixing member 22 may be made of a material having an insulating property such as an epoxy resin to be insulated from the terminals 21 of the control board 20.

Since only a single control board 20 is described in this embodiment, the image drum 10 is illustrated as having a single slot 11. However, the number of control boards 20 and the number of slots 11 of the image drum 10 corresponding to the control board 20 may be variable according to conditions where an image is formed.

The plurality of ring electrodes 30 are formed along the outer circumference of the image drum 10 at a regular interval as shown in FIG. 1A.

The ring electrodes 30 have a pitch of about 40 μm to realize a resolution of about 600 dpi, and are formed along the outer circumference of the image drum 10. The pitch between the ring electrodes 30 is variable according to a desired resolution.

Figure 3A:
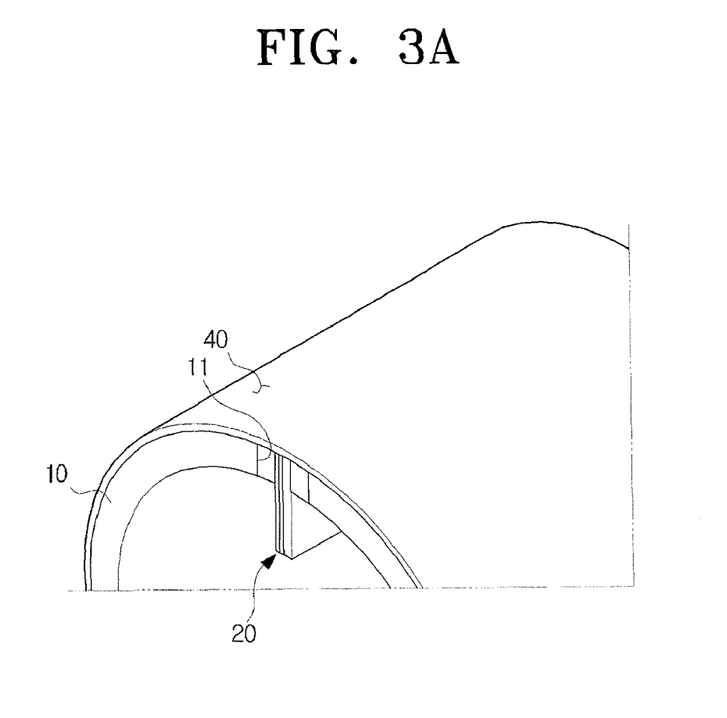
FIGS. 3A and 3B are a perspective view and a cross-section view, respectively, schematically illustrating an insulation layer coated over the image drum of FIGS. 2A and 2B.
Figure 3B:
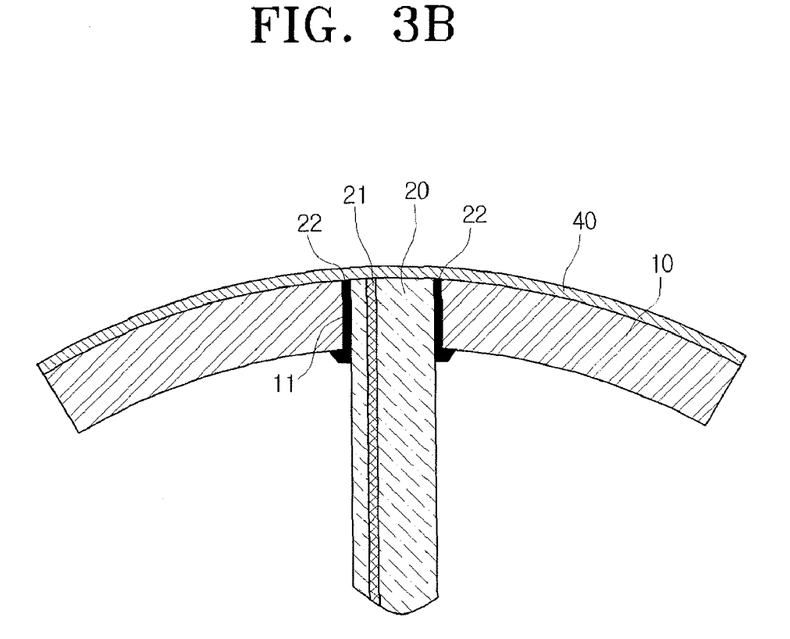
Figure 4:
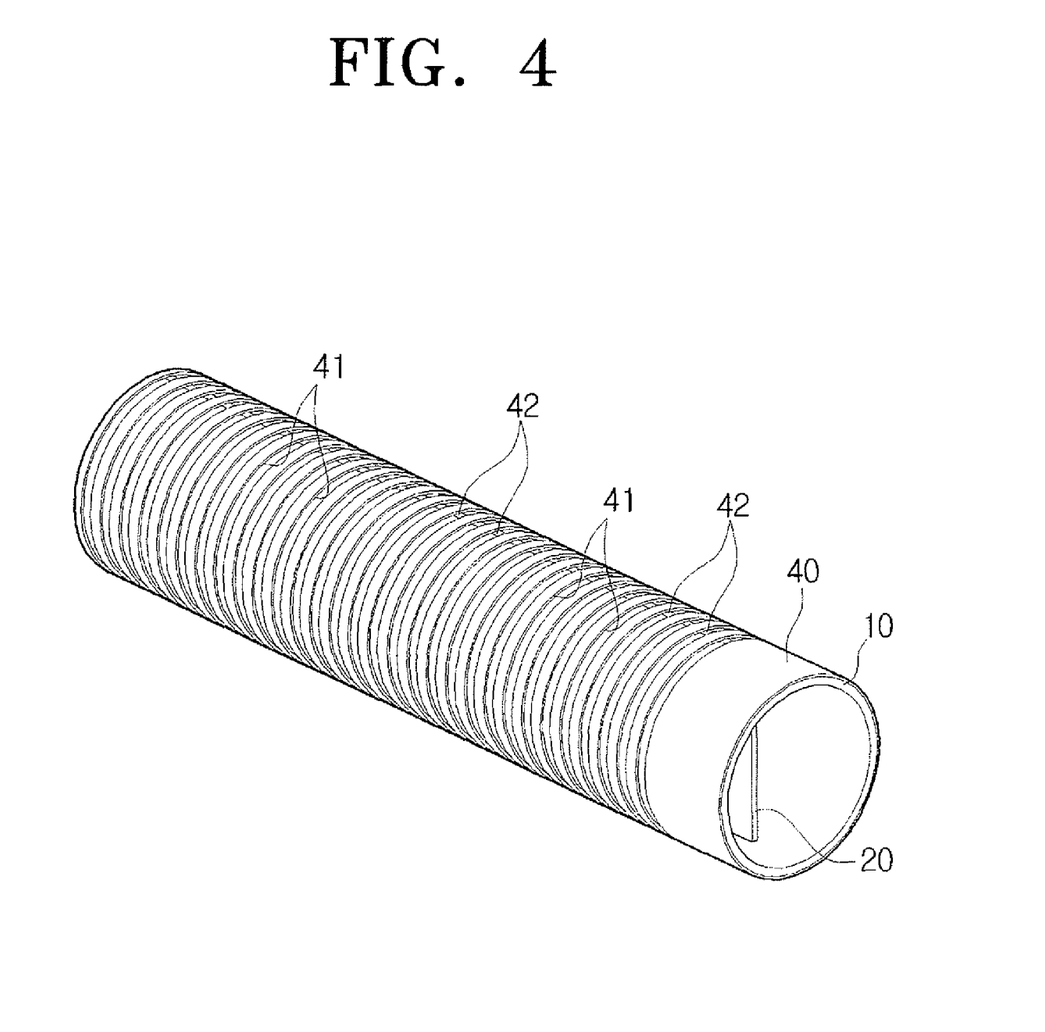
FIG. 4 is a perspective view schematically illustrating installation recesses and connection holes which are formed on the insulation layer of FIG. 3A.

In order to insulate the plurality of ring electrodes 30 and the outer circumference of the image drum 10 from each other, an insulation layer 40 is formed between the ring electrodes 30 and the image drum 10 as shown in FIG. 3B. Also, as shown in FIG. 4, a plurality of connection holes 42 are formed penetratingly through the insulation layer 40 to expose the plurality of terminals 21 in one-to-one correspondence and thus electrically connect the electrodes 21 of the control board 20 to the ring electrodes 30.

Also, the plurality of ring electrodes 30 are formed by ink-jetting or filling conductive ink, and for this, a plurality of installation recesses 41 (see FIG. 4) are formed along the outer circumference of the image drum 10 to receive the supplied conductive ink. That is, the plurality of installation recesses 41 are formed on the insulation layer 40 to provide partitions to receive the ink-jetted conductive inks.

As a result, between the ring electrodes 30 and the image drum 10 is provided the insulation layer 40 which has an insulating property and has the plurality of installation recesses 41 to form the ring electrodes 30 and the plurality of connection holes 42 to connect the terminals 21 to the ring electrodes 30.

As shown in FIGS. 3A and 3B, the insulation layer 40 is formed by jetting and coating a resin having an insulating property over the entire outer circumference of the image drum 10 to have a predetermined thickness. The insulation layer 40 is formed of a photosensitive resin which is hardened by being exposed to ultraviolet rays.

For reference, the photosensitive resin of the insulation layer 40 is divided into a positive type and a negative type according its exposing and developing ways. In this embodiment, the photosensitive resin is a negative type such that an area developed after being exposed to rays remains as a structure and a non-exposed area is removed in a developing process. This positive type photosensitive resin includes SU-8 and BCB.

Figure 5A:
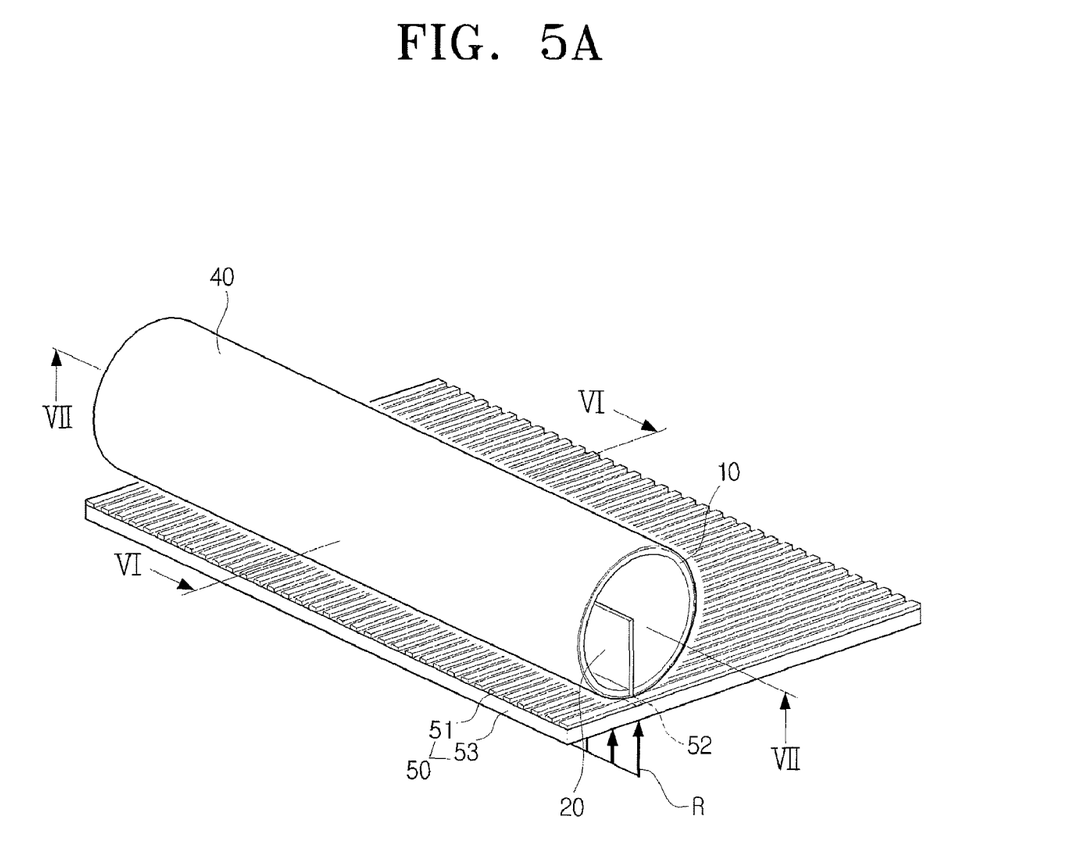
FIGS. 5A and 5B are perspective views illustrating a process of forming the installation recesses and the connection holes on the insulation layer using a pressure exerted by a pressure plate and the photolithography process.
Figure 5B:
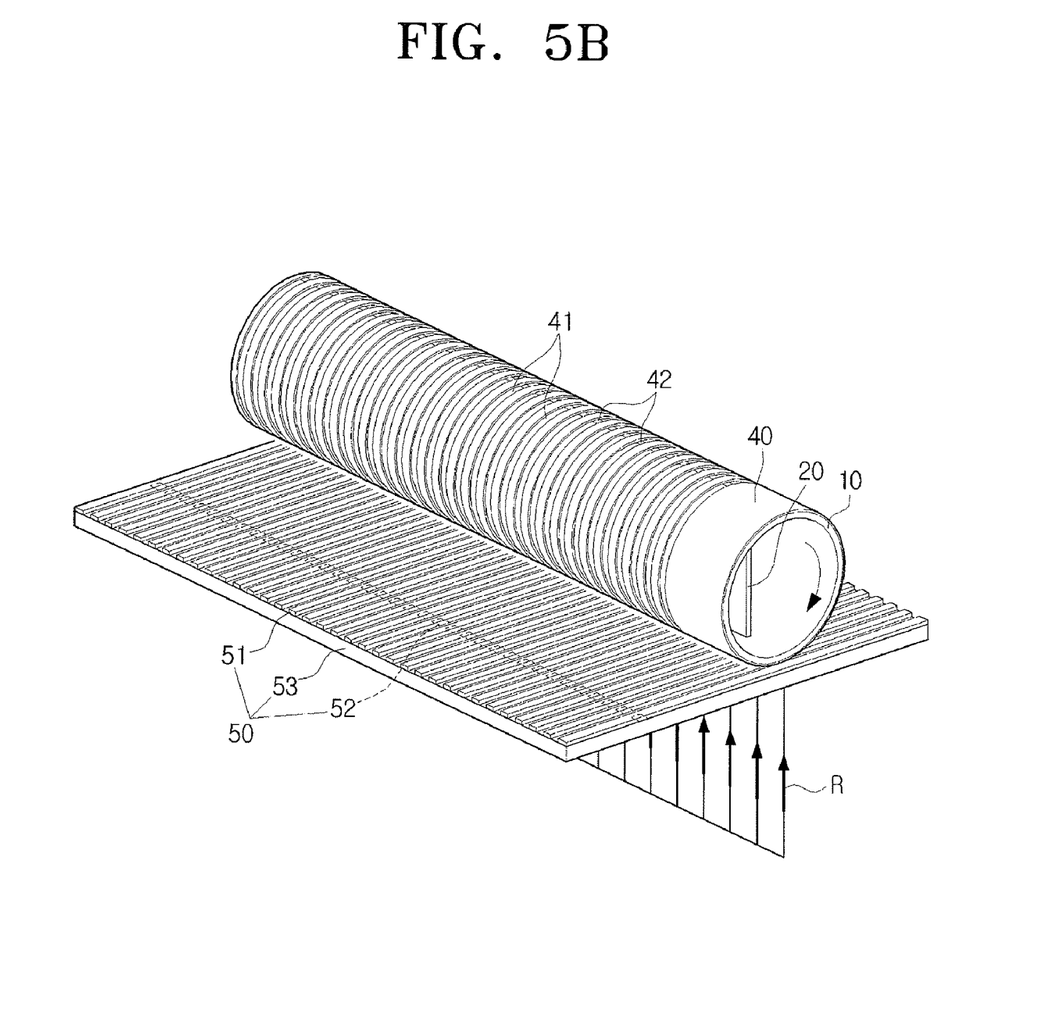

In order to form the plurality of installation recesses 41 and the plurality of connection holes 42 on the insulation layer 40 as shown in FIG. 4, a pressure plate 50 is provided as shown in FIGS. 5A and 5B. The pressure plate 50 is brought into press-contact with the image drum 10 coated with the insulation layer 40.

The pressure plate 50 comprises a plurality of pressure protrusions 51 corresponding to the installation recesses 41 and a support plate 53.

Figure 7A:
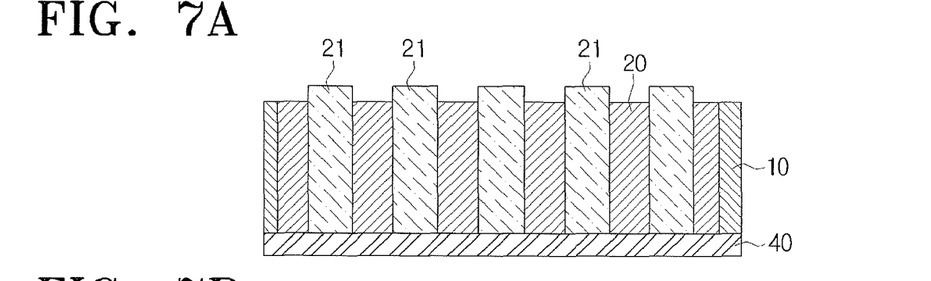
FIGS. 7A to 7D are cross-section views taken along line VII-VII of FIG. 5A and illustrating processes of forming the installation recesses and the connection holes on the insulation layer and then forming ring electrodes in sequence.
Figure 7B:
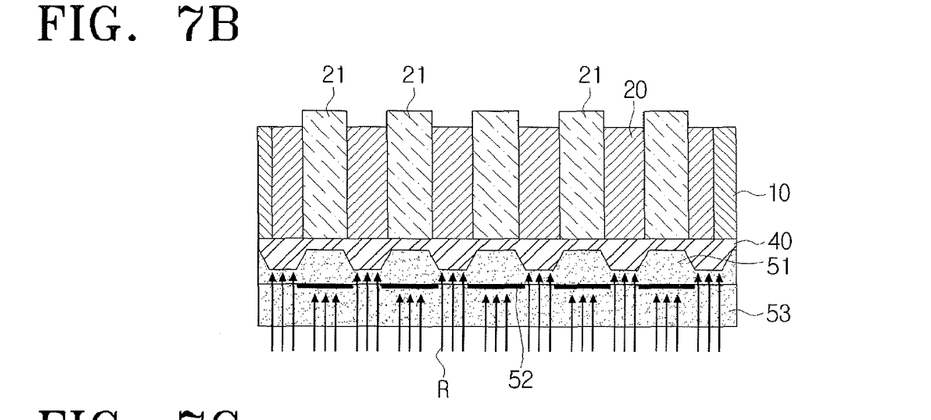

The plurality of pressure protrusions 51 are pressed into the insulation layer 40 formed of the photosensitive resin, as shown in FIG. 7B, thereby forming the installation recesses 41. For this, the plurality of pressure protrusions 51 are arranged apart from one another by a predetermined distance, which corresponds to the pitch between the ring electrodes 30 to be formed by conductive ink, for example, about 40 µm. The pressure protrusions 51 may be made of a soft material such as polydimethylsiloane (PDMS).

The support plate 53 supports the plurality of pressure protrusions 51 and both the plurality of protrusions 51 and the support plate 53 are made of a material that is permeable to ultraviolet rays R.

Also, in order to form the plurality of connection holes 42 on the insulation layer 40, the pressure plate 50 has a plurality of ultraviolet ray-blocking members 52 to block the transmission of the ultraviolet rays R in a pattern corresponding to the connection holes 42.

Figure 7C:
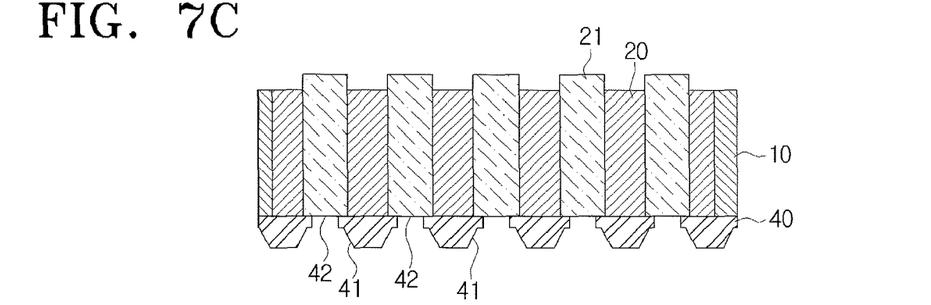

More specifically, the connection holes 42 are formed penetratingly through the insulation layer 40 using a photolithography process as shown in FIGS. 7B and 7C. According to the photolithograph process, if an area of a negative type photosensitive resin that is not exposed to the ultraviolet rays R is developed, the area is removed.

For this, the ultraviolet ray-blocking members 52 disposed on the pressure plate 50 are formed in a pattern corresponding to the terminals 21 of the control board 20. That is, the pressure plate 50 and the ultraviolet ray-blocking members 52 disposed on the pressure plate 50 in a predetermined pattern serve as a mask where a predetermined pattern required for a photolithography process is patterned.

The shapes of the ultraviolet ray-blocking members 52 correspond to those of the connection holes 42 to be formed on the insulation layer 40. Therefore, the ultraviolet ray-blocking members 52 may be made of a metallic material and each may have a width larger than those of the terminals 21 but smaller than that of the slot 11 for stable connection between the terminals 21 of the control board 20 and the ring electrodes 30.

Also, the ultraviolet ray-blocking members 52 are disposed in the pressure protrusions 51 to form the installation recesses 41, and more specifically, are disposed between the pressure protrusions 51 and the support plate 53. However, the ultraviolet ray-blocking members 52 may be disposed on uppermost ends, i.e., on the protruding surfaces of the pressure protrusions 51, and in this case, an extra protecting means may be further provided to prevent the ultraviolet ray-blocking members 52 of a metallic material from being worn due to a pressure and a contact force between the pressure protrusions 51 and the insulation layer 40.

For reference, in this embodiment, the pressure plate 50 is illustrated as being divided into the support plate 53 and the pressure protrusions 51 to explain where the ultraviolet ray-blocking members 52 are located. However, this should not be considered as limiting. The support plate 53 and the pressure protrusions 51 may be formed integrally with each other with the blocking members 52 disposed therebetween.

Figure 6:
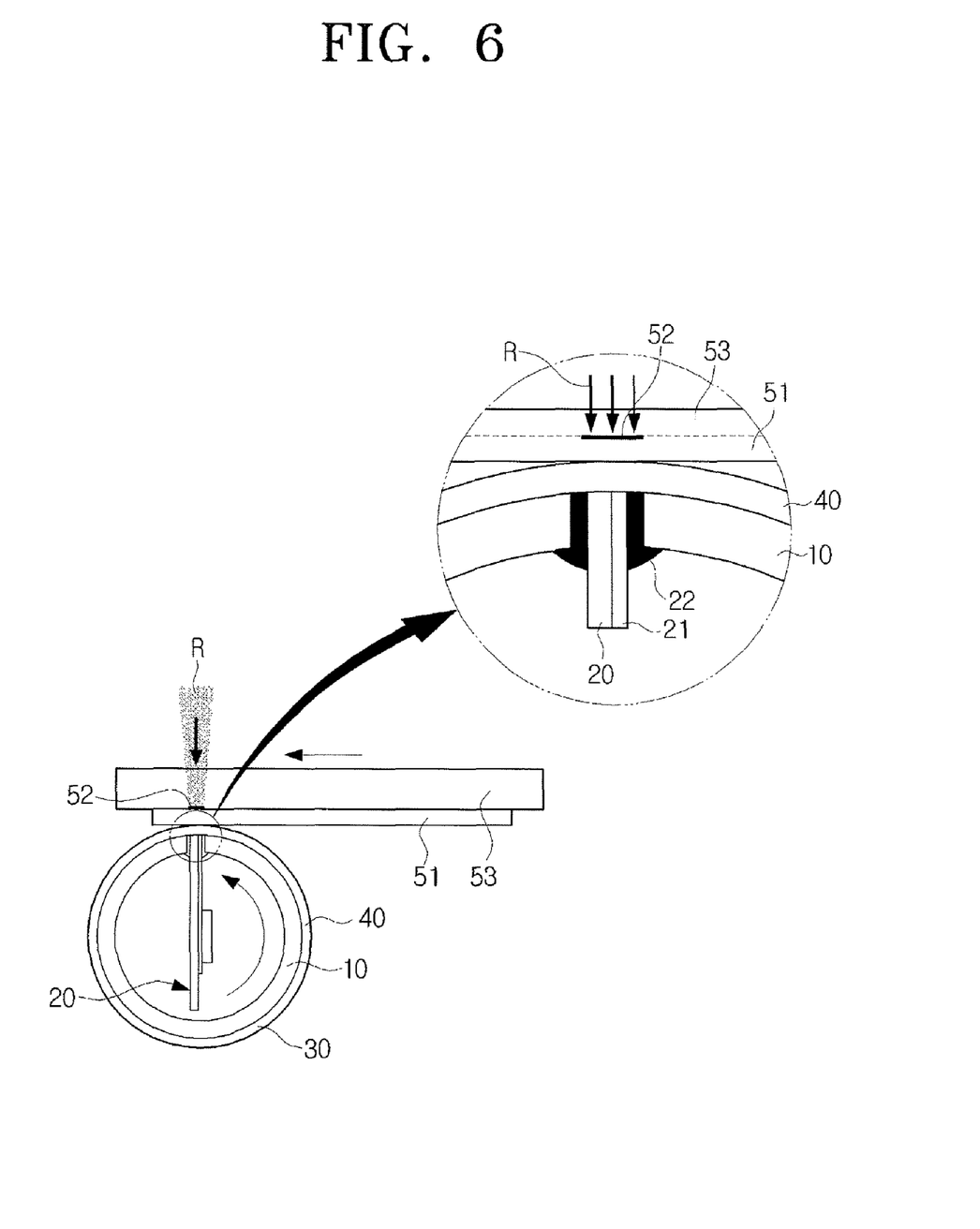
FIG. 6 is a cross-section view taken along line VI-VI of FIG. 5A.

The ultraviolet rays R are radiated from a light source (not shown) toward the image drum 10 via the pressure plate 50 in a substantially straight line. As shown in FIG. 6, the ultraviolet rays R has radiation areas substantially corresponding to the ultraviolet ray-blocking members 52, thereby allowing the connection holes 42 to be stably formed.

A method of manufacturing an image forming element 100 according to the exemplary embodiment of the present general inventive concept described above will now be described with reference accompanying drawings.

As shown in FIGS. 2A and 2B, the image drum 10 having at least one slot 11 formed along a lengthwise direction thereof is prepared, and then, the control board 20 is disposed inside the image drum 10 such that terminals 21 are located in the slot 11. Opposite surfaces of the control board 20 is bonded and fixed to the image drum 10 by the fixing member 22.

After that, as shown in FIGS. 3A and 3B, a negative type photosensitive resin is coated over the entire outer circumference of the image drum 10 to form a photosensitive resin layer of a predetermined thickness, i.e., the insulation layer 40.

The image drum 10 coated with the insulation layer 40 is arranged in contact with the pressure plate 50 as shown in FIG. 5A. At this time, the image drum 10 and the pressure plate 50 are contact-pressed to each other such that the ultraviolet ray-blocking members 52 of the pressure plate 50 face the terminals 21 arranged in the slot 11 of the image drum 10 as shown in FIG. 6.

After that, the ultraviolet rays R generated at a light source (not shown) are radiated toward the image drum 10 via the pressure plate 50. Then, as shown in FIGS. 6 and 7B, the surface of the image drum 10 is exposed to the ultraviolet rays R which are entered via the pressure plate 50 except for the ultraviolet ray-blocking members 52 to block the transmission of the ultraviolet rays R.

The image drum 10 to which the ultraviolet rays R are radiated via the pressure plate 50 is rotated in press-contact with the pressure protrusions 51 of the pressure plate 50 as shown in FIG. 5B. Accordingly, the installation recesses 41 are formed on the insulation layer 40 due to a property of the photosensitive resin and the pressure protrusions 51.

As shown in FIG. 5B, only the image drum 10 may be rotated in one direction, but as shown in FIG. 6, both the image drum 10 and the pressure plate 50 may be moved together such that the pressure plate 50 is slidably moved while in press-contact with the image drum 10. Also, the pressure plate 50 may move along the outer circumference of the image drum 10 in a pressed state to form the installation recesses 41.

The image drum 10 when rotating in press-contact with the pressure plate 50 is continuously exposed to the ultraviolet rays R and thus the insulation layer 40 except for the area protected from the ultraviolet rays R by the ultraviolet ray-blocking members 52 is exposed to the ultraviolet rays R.

Herein, a rotation driving means (not shown) is provided to support at least one end of the image drum 10 and rotate the image drum 10 in press-contact with the pressure plate 50.

Figure 8A:
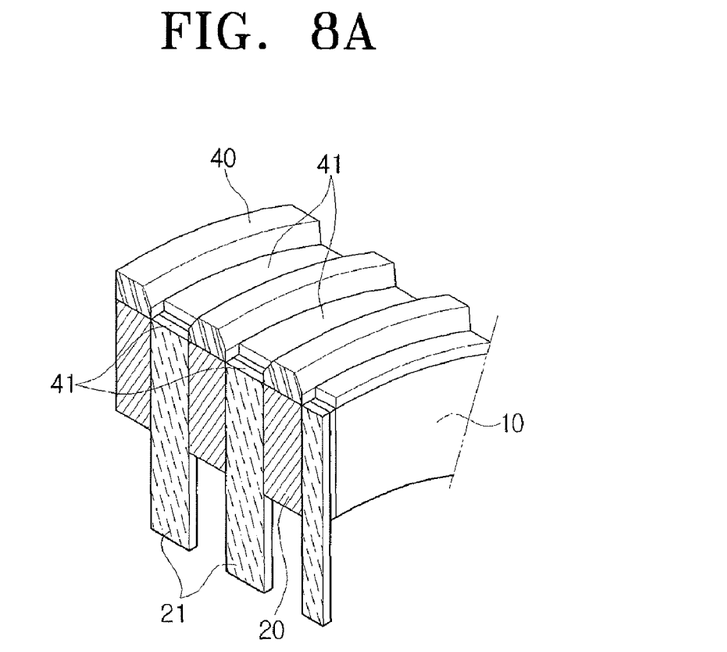
FIG. 8A is a cross-section view schematically illustrating the installation recesses and the connection holes formed on the insulation layer.

The insulation layer 40 of the image drum 10 is developed using a developer after one time rotation in contact with the pressure plate 50 such that the area exposed to the ultraviolet rays R remains as a structure and the area protected from the ultraviolet rays by the ultraviolet ray-blocking member 52 is removed as shown in FIGS. 7C and 8A.

As described above, the installation recesses 41 and the connection holes 42 are formed on the insulation layer 40 simultaneously by rotating the image drum 10 on which the insulation layer 40 is formed in press-contact with the pressure plate 50 having the pressure protrusions 51 and the blocking members 52 and also exposing the image drum 10 and the pressure plate 50 to the ultraviolet rays. Accordingly, an extra cutting process for forming the installation recesses 41 and the connection holes 42 is not required and so the manufacturing process can be simplified. Also, a manufacturing time and a manufacturing cost can be reduced.

Figure 7D:
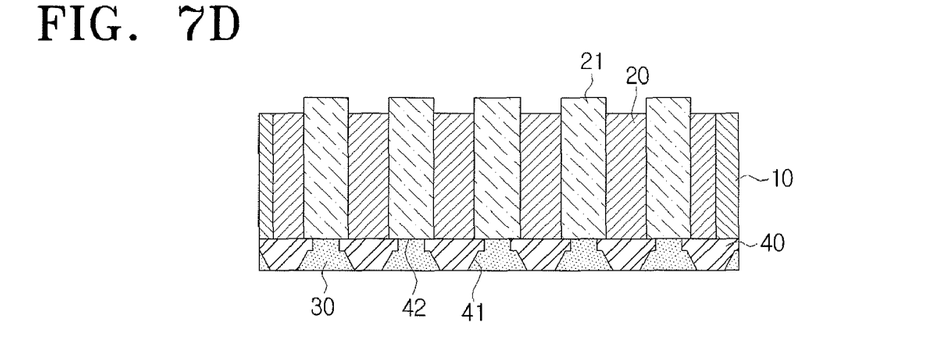
Figure 8B:
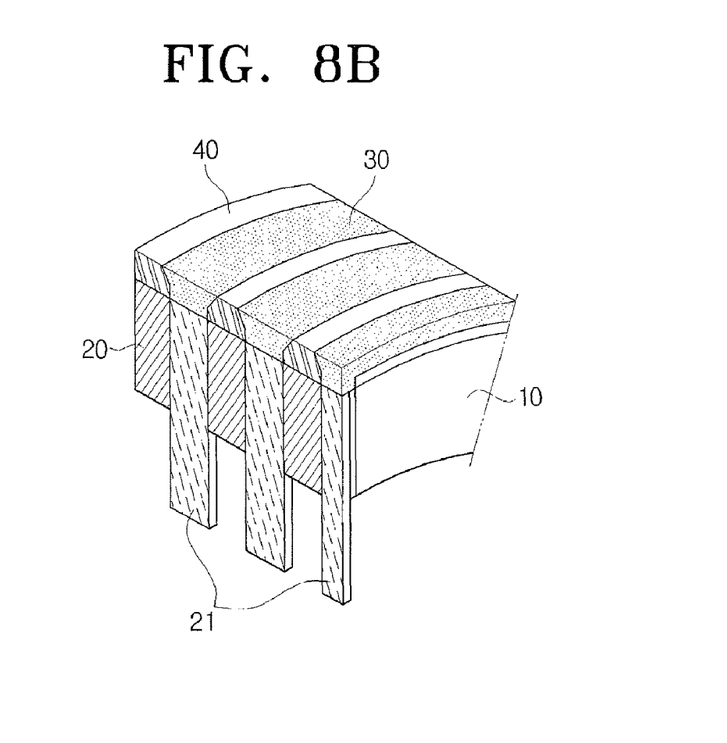
FIG. 8B is a cross-section view schematically illustrating the ring electrodes formed in the installation recesses and the connection holes.

After that, as shown in FIGS. 7D and 8B, the ring electrodes 30 are formed by ink-jetting conductive ink to the installation recesses 41 and the connection holes 42 of the insulation layer 40. Accordingly, the ring electrodes 30 are connected to the terminals 21 through the connection holes 42 and are formed in the installation recesses 41 of the insulation layer 40 apart from one another by a predetermined distance.

Figure 9:
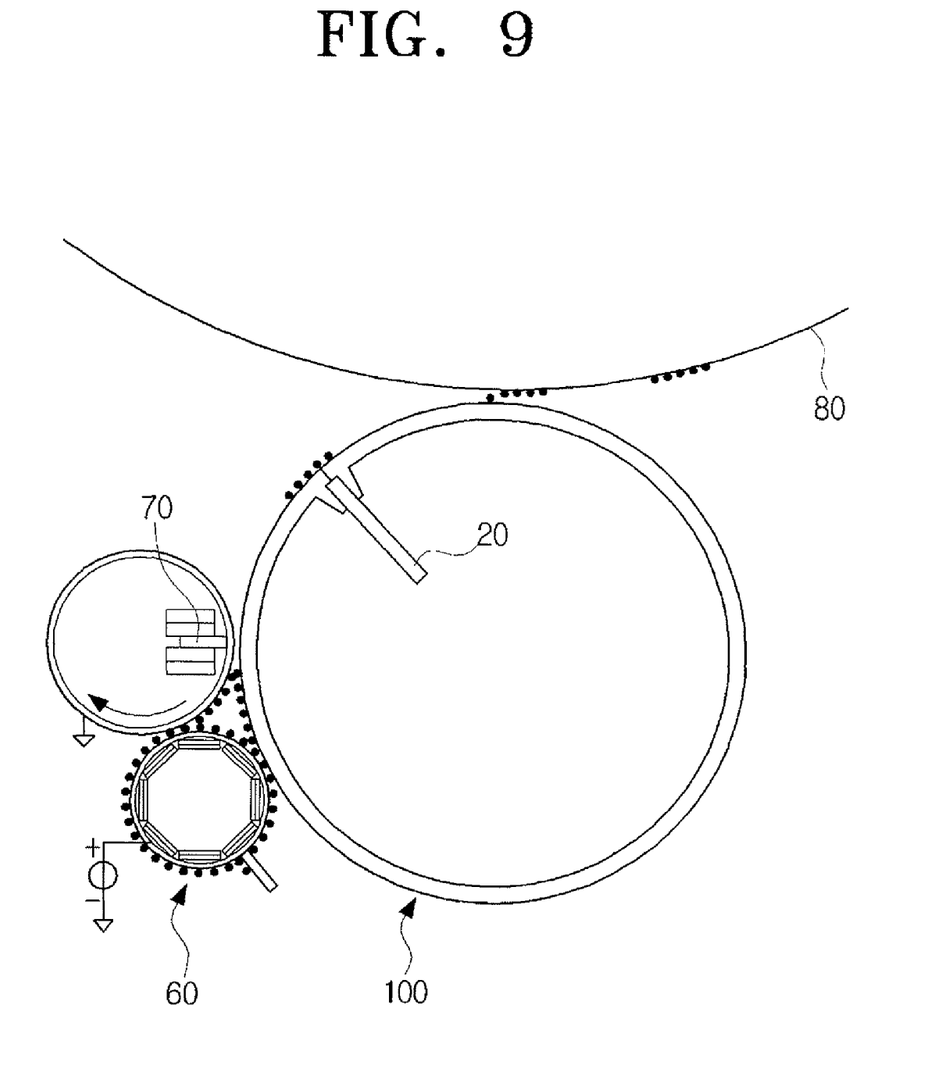
FIG. 9 is a view schematically illustrating an image forming apparatus employing an image forming element manufactured according to the exemplary embodiment of the present general inventive concept.

A toner is adhered to the image forming element 100 manufactured through the above-described manufacturing process from a toner supply unit 60 due to an electrostatic force as shown in FIG. 9. A part of the toner adhered to the image forming element 100 is removed from the image forming element 100 by a magnetic cover 70, and the remainder of toner is developed by an image developing unit 80 and thus transferred to a printing medium. Accordingly, a predetermined image is formed on the printing medium in a direct printing method.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An image forming element, comprising:
   a cylindrical image drum which has at least one slot formed along lengthwise direction;
   a control board which has a plurality of terminals and is arranged inside the image drum such that the plurality of terminals are located in the slot;
   a photosensitive resin layer which comprises a plurality of installation recesses formed along a circumference of the image drum to correspond to the plurality of terminals, and a plurality of connection holes to expose the terminals through an area of each of installation recesses, the photosensitive resin layer being formed along an outer circumference of the image drum; and
   a plurality of ring electrodes which are formed in the installation recesses and the connection holes.

2. The image forming element as claimed in claim 1, wherein the installation recesses are formed by pressing the photosensitive resin layer,
   wherein the connection holes are formed by selectively removing the photosensitive resin layer using a photolithography process.

3. The image forming element as claimed in claim 2, comprising a pressure plate which is made of a material permeable to ultraviolet rays and comprises a plurality of pressure protrusions corresponding to the installation recesses and a plurality of ultraviolet-ray blocking members to block transmission of the ultraviolet rays to form the connection holes.

4. The image forming element as claimed in claim 3, wherein the installation recesses and the connection holes are formed by bring the image drum and the pressure plate into press-contact with each other such that the ultraviolet ray-blocking members face the terminals, exposing the photosensitive resin layer to ultraviolet rays via the pressure plate and rotating the image drum in press-contact with the pressure plate, and then developing the photosensitive resin layer.

5. The image forming element as claimed in claim 4, wherein the exposing of the photosensitive resin layer to the ultraviolet rays and the rotating of the image drum in press-contact with the pressure plate are simultaneously performed.

6. The image forming element as claimed in claim 4, wherein the photosensitive resin layer is formed of a negative type photosensitive resin,
   wherein the plurality of ultraviolet ray-blocking members are disposed in the pressure protrusions.

7. The image forming element as claimed in claim 6, wherein the pressure plate comprises the plurality of pressure protrusions and a support plate to support the pressure protrusions,
   wherein the ultraviolet ray-blocking members are disposed between the support plate and the pressure protrusions.

8. The image forming element as claimed in claim 7, wherein the pressure protrusions are formed of a soft PDMS.

9. The image forming element as claimed in claim 1, wherein the ring electrodes are formed by supplying conductive ink to the installation recesses and the connection holes.

10. An image forming apparatus comprising:
    a toner supply unit;
    an image forming element to which a toner is adhered from the toner supply unit; and
    an image developing unit to separate at least a part from the toner adhered to the image forming element, develop an image on the image forming body, and transfer the image to a printing medium,
    wherein the image forming element comprises:
      a cylindrical image drum which has at least one slot formed along a lengthwise direction;
      a control board which has a plurality of terminals to be located in the slot and is arranged inside the image drum;
      an insulation layer which is formed by coating a photosensitive resin over an outer circumference of the image drum, and comprises a plurality of installation recesses which are formed along a circumference of the image drum by being pressed by a plurality of pressure protrusions corresponding to the plurality of terminals, and a plurality of connection holes which are formed by selectively removing areas facing the plurality of terminals through a photolithography process; and
      a plurality of ring electrodes which are formed in the installation recesses and the connection holes.

11. An image forming element, comprising:
    a cylindrical image drum;
    a control board disposed inside the cylindrical image drum and having a plurality of terminals;
    a photosensitive resin layer being formed along an outer circumference of the image drum and having a plurality of connection holes respectively corresponding to the plurality of terminals; and
    a plurality of ring electrodes formed on the photosensitive resin layer and respectively connected to the plurality of terminals through the plurality of connection holes.

* * * * *